United States Patent
Mametani et al.

(10) Patent No.: US 6,175,156 B1
(45) Date of Patent: *Jan. 16, 2001

(54) SEMICONDUCTOR DEVICE WITH IMPROVED INTERCONNECTION

(75) Inventors: Tomoharu Mametani; Yukihiro Nagai, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/063,414

(22) Filed: Apr. 21, 1998

(30) Foreign Application Priority Data

Nov. 21, 1997 (JP) .................................................... 9-320850

(51) Int. Cl.[7] ............................ H01L 23/48; H01L 23/52; H01L 29/40

(52) U.S. Cl. ......................... 257/758; 257/751; 257/754; 257/757; 257/763; 257/770; 257/750; 257/760; 438/627; 438/629; 438/630; 438/643; 438/647; 438/648

(58) Field of Search .................................... 257/751, 752, 257/754, 756, 757, 758, 759, 763, 770, 750, 760; 438/627, 629, 630, 643, 647, 648

(56) References Cited

U.S. PATENT DOCUMENTS

| 4,648,937 | * | 3/1987 | Ogura et al. | 156/643 |
| 4,833,519 | * | 5/1989 | Kawano et al. | 257/752 |
| 5,027,185 | * | 6/1991 | Liauh | 357/59 |
| 5,036,382 | * | 7/1991 | Yamaha | 257/770 |
| 5,404,046 | * | 4/1995 | Matsumoto et al. | 257/750 |
| 5,578,518 | * | 11/1996 | Koike et al. | 438/424 |
| 5,739,587 | * | 4/1998 | Sato | 257/758 |
| 6,015,326 | * | 1/2000 | Potter | 445/52 |

FOREIGN PATENT DOCUMENTS

| 01120037A | * | 5/1989 | (JP) . |
| 1-120037 | * | 5/1989 | (JP) . |

OTHER PUBLICATIONS

Stanley Wolf and Richard N. Tauber, Silicon Processing for the VLSI Era, vol. 1: Process Technology, p. 397, 1986.*

* cited by examiner

Primary Examiner—Minh Loan Tran
Assistant Examiner—Luan Thai
(74) Attorney, Agent, or Firm—McDermott, Will & Emery

(57) ABSTRACT

An improved semiconductor device which prevents a short circuit between a wiring layer and a semiconductor substrate, caused by the penetration of a contact hole, will be provided. A lower conducting layer is formed on a second interlayer insulating film. A third interlayer insulating film covers lower conducting layer. A contact hole is formed in third interlayer insulating film in order to connect an upper conducting layer and lower conducting layer. A stopper layer of silicide or metal is formed below contact hole between the surface of a semiconductor substrate and lower conducting layer.

7 Claims, 2 Drawing Sheets

SEMICONDUCTOR DEVICE WITH IMPROVED INTERCONNECTION

BACKGROUND OF THE INVENTION

1. Field of the Invention

The present invention relates generally to a semiconductor device, and more particularly to an improved semiconductor device having an interconnection (wiring) layer and being capable of preventing a short-circuit between the wiring layer and another wiring layer with different potential or between the wiring layer and a semiconductor substrate.

2. Description of the Background Art

FIG. 3 is a sectional view of a semiconductor device such as a semiconductor memory device having a conventional structure of multilayer interconnection.

Referring to FIG. 3, an interlayer insulating film 5a is formed on a semiconductor substrate 1. A first conducting layer 2 is formed on interlayer insulating film 5a. An interlayer insulating film 5b is formed on interlayer insulating film 5a such that it covers first conducting layer 2. A second conducting layer 3 is formed on interlayer insulating film 5b. An interlayer insulating film 5c is formed on interlayer insulating film 5b such that it covers second conducting layer 3. A contact hole 6a is formed in interlayer insulating films 5a, 5b, and 5c in order to expose the surface of semiconductor substrate 1. A contact hole 6b is formed in interlayer insulating film 5c in order to expose the surface of second conducting layer 3. Contact hole 6b penetrates second conducting layer 3, interlayer insulating film 5b, and interlayer insulating film 5a, reaching the surface of semiconductor substrate 1. A contact hole 6c is formed in interlayer insulating films 5b and 5c in order to expose the surface of first conducting layer 2. A third conducting layer 4a is formed on interlayer insulating film 5c such that it is connected to the surface of semiconductor substrate 1 through contact hole 6a. A third conducting layer 4b is formed on interlayer insulating film 5c such that it is connected to second conducting layer 3 through contact hole 6b. Third conducting layer 4b is connected to first conducting layer 2 through contact hole 6c.

Referring to FIG. 3, in a conventional semiconductor device, conducting layers are connected to each other through contact holes formed in an interlayer insulating film to connect two conducting layers formed across different layers.

As shown in FIG. 3, however, the total thickness of interlayer insulating films 5a, 5b and 5c formed between third conducting layer 4a and semiconductor substrate 1, the thickness of interlayer insulating film 5c formed between third conducting layer 4b and second conducting layer 3, and the thickness of interlayer insulating films 5b and 5c formed between third conducting layer 4b and first conducting layer 2 are different. Therefore, when contact holes 6a, 6b and 6c are formed simultaneously, contact hole 6b penetrates second conducting layer 3 and reaches the surface of semiconductor substrate 1, by the etching to form contact hole 6a reaching the surface of semiconductor substrate 1.

Such a penetration occurs when etching selectivity of second conducting layer 3 to interlayer insulating film 5c is small. In other words, penetration of second conducting layer 3 occurs when the difference between the etching rate of second conducting layer 3 and the etching rate of interlayer insulating film 5a, 5b, 5c is small. For example, the etching selectivity of interlayer insulating film 5c to materials such as polysilicon and doped polysilicon is small.

Thus, in the conventional device, when second conducting layer 3 is formed of a material of small etching selectivity to interlayer insulating film 5c, contact hole 6b penetrates second conducting layer 3. As a result, a short circuit is formed between one wiring layer and another wiring layer with different potential or between a wiring layer and a semiconductor substrate.

SUMMARY OF THE INVENTION

The present invention was made to solve the problems described above. An object of the invention is to provide an improved semiconductor device which prevents a short circuit as described above.

The invention according to an aspect relates to a semiconductor device having an upper conducting layer and a lower conducting layer connected via a contact hole. The semiconductor device includes a semiconductor substrate having a surface. A first interlayer insulating film is formed on the semiconductor substrate. The lower conducting layer is formed on the first interlayer insulating film. A second interlayer insulating film is formed on the first interlayer insulating film such that it covers the lower conducting layer. An upper conducting layer is formed on the second interlayer insulating film. A contact hole is formed in the second interlayer insulating film in order to connect the upper conducting layer and the lower conducting layer. A stopper layer of silicide or metal is formed directly below the contact hole between the surface of the semiconductor substrate and the lower conducting layer.

In accordance with the present invention, because of the stopper layer of silicide or metal formed directly below the contact hole between the surface of the semiconductor substrate and the lower conducting layer, even if the contact hole penetrates the lower conducting layer, further penetration can be prevented.

In a semiconductor device according to another aspect, the etching selectivity of a second interlayer insulating film to a stopper layer becomes high because the stopper layer is formed of WSi.

In a semiconductor device according to a further aspect, a stopper layer is formed of TiSi. Therefore the etching selectivity of a second interlayer insulating film to the stopper layer becomes high.

In a semiconductor device according to a still further aspect, a stopper layer includes two layers, one of WSi and another of polysilicon. Therefore the etching selectivity of a second interlayer insulating film to the stopper layer becomes high.

In a semiconductor device according to a still further aspect, a stopper layer is at the same potential as an upper conducting layer. Therefore, short circuits can be prevented even if a contact hole penetrates a lower conducting layer and reaches the stopper layer.

In a semiconductor device according to a still further aspect, a stopper layer is set to a floating state. Therefore, short circuits would not be formed even if a contact hole penetrates a lower conducting layer and reaches the stopper layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Referring to the figures, a preferred embodiment of the invention will be described hereinafter.

Figure 1:
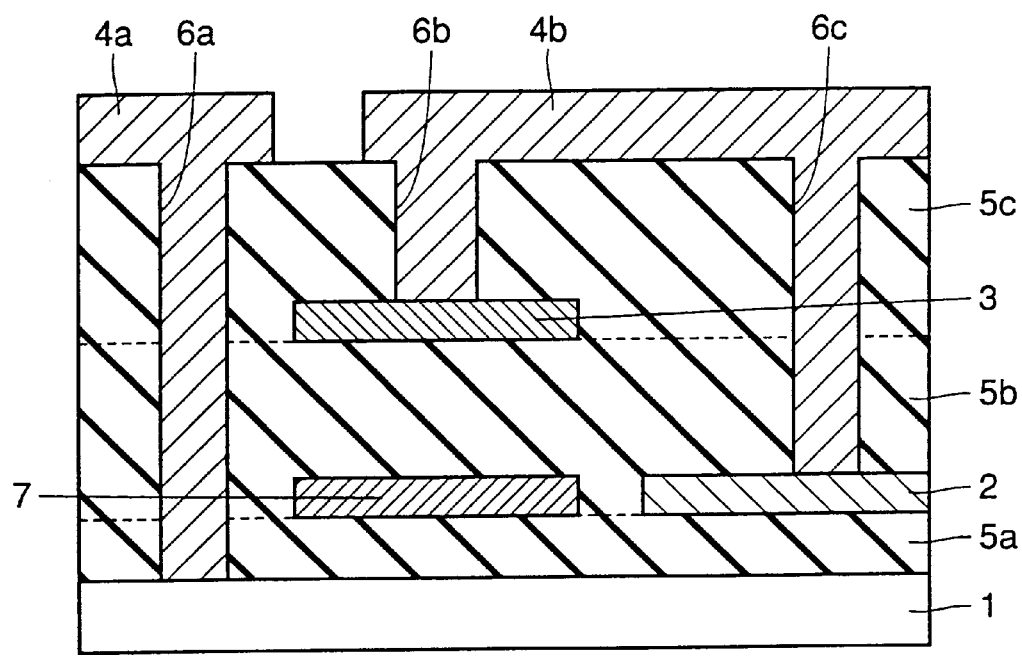
FIG. 1 is a sectional view of a semiconductor device according to a preferred embodiment.

FIG. 1 is a sectional view of a semiconductor device according to the preferred embodiment. The semiconductor device includes a semiconductor substrate 1. A first interlayer insulating film 5a is formed on semiconductor substrate 1. A first conducting layer 2 and a stopper layer 7 are formed on first interlayer insulating film 5a. Stopper layer 7 will be described later.

An interlayer insulating film 5b is formed on interlayer insulating film 5a such that it covers first conducting layer 2 and stopper layer 7. A second conducting layer 3 is formed on interlayer insulating film 5b. An interlayer insulating film 5c is formed on interlayer insulating film 5b such that it covers second conducting layer 3. A contact hole 6a is formed in interlayer insulating films 5a, 5b and 5c in order to expose the surface of semiconductor substrate 1. A contact hole 6b is formed in interlayer insulating film 5c in order to expose the surface of second conducting layer 3. A contact hole 6c is formed in interlayer insulating films 5b and 5c in order to expose the surface of first conducting layer 2.

An upper conducting layer 4a is formed on interlayer insulating film 5c such that it is connected to the surface of semiconductor substrate 1 through contact hole 6a. An upper conducting layer 4b is formed on interlayer insulating film 5c such that it is connected to second conducting layer 3 through contact hole 6b. Upper conducting layer 4b is also connected to first conducting layer 2 through contact hole 6c.

In accordance with the semiconductor device of the preferred embodiment, stopper layer 7 is formed between the surface of semiconductor substrate 1 and second conducting layer 3. Stopper layer 7 is formed below contact hole 6b. Stopper layer 7 is formed of a material with high etching selectivity, such as silicide like WSi or TiSi, or metal. In other words, stopper layer 7 is formed of a material, such as a silicide, e.g., WSi or TiSi, or a metal, each of which has a very slow etching rate compared with the interlayer insulating film.

Figure 2:
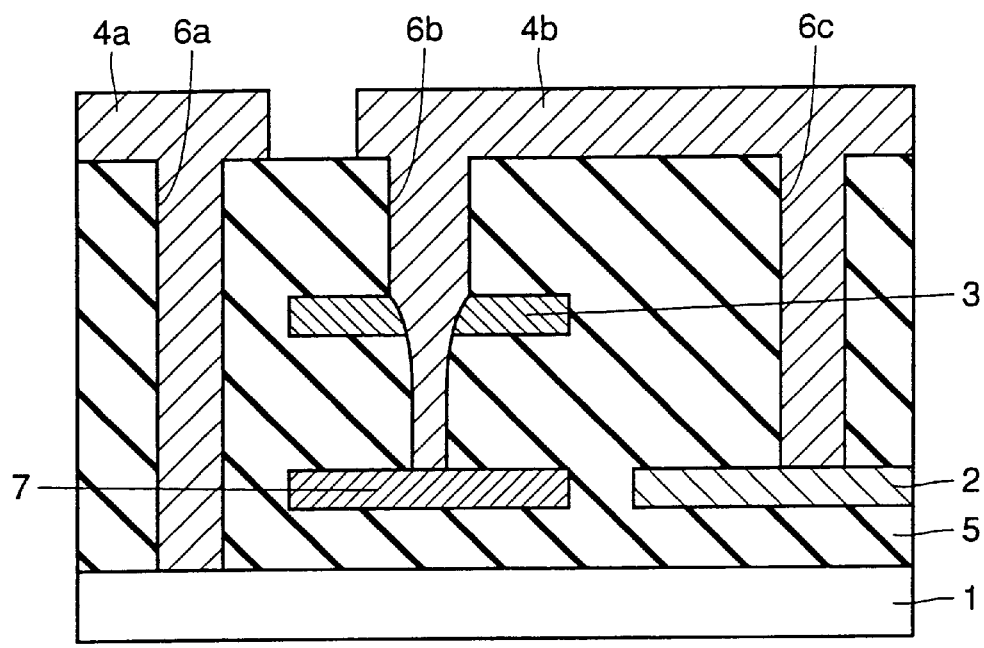
FIG. 2 is a view shown to explain the effects of the semiconductor device according to the preferred embodiment.
Figure 3:
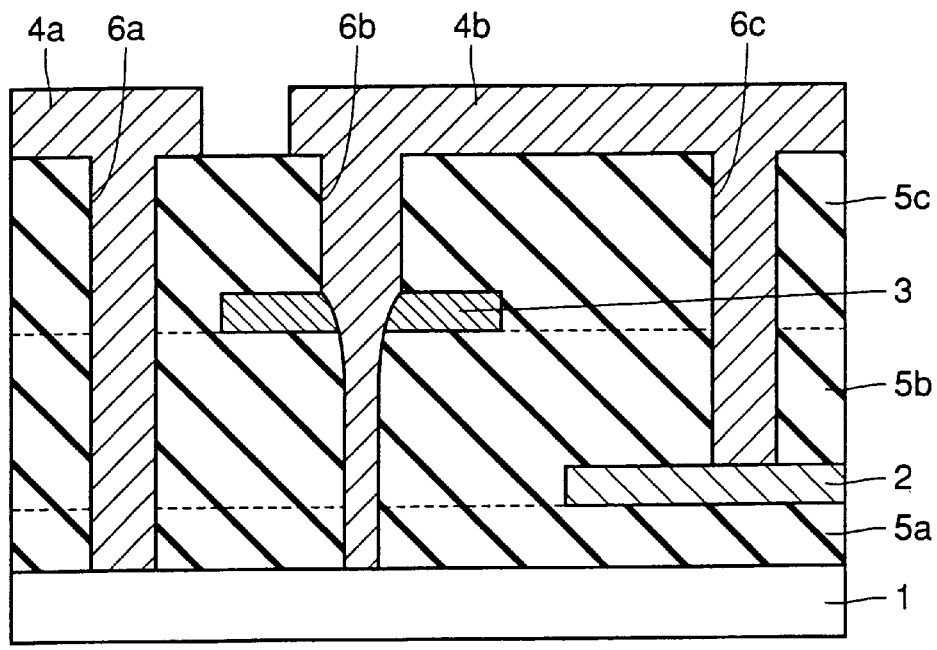
FIG. 3 is a sectional view of a conventional semiconductor device.

Referring to FIG. 2, in accordance with the semiconductor device of the preferred embodiment, even if contact hole 6b penetrates second conducting layer 3 at the formation of contact holes 6a, 6b, and 6c, contact hole 6b would not reach the surface of semiconductor substrate 1, because of the stopper layer 7. Therefore, a short circuit would not be formed between semiconductor substrate 1 and third conducting layer 4b, even when third conducting layer 4b is filled in contact hole 6b.

In addition, stopper layer 7 may include two or more layers of different materials such as WSi and polysilicon stacked one upon another. Although the etching selectivity of polysilicon itself is small, because of the existence of WSi the etching selectivity in total is high. In other words, although the difference between the etching rate of polysilicon itself and the etching rate of the interlayer insulating film 5b is small, because of the existence of WSi, which has a very small etching rate, the etching rate of stopper layer 7 in total is slow compared with the etching rate of interlayer insulating film 5b.

In addition, preferably stopper layer 7 is at the same potential as third conducting layer 4. Further, preferably stopper layer 7 is at a floating state.

In the above description of the preferred embodiment, means to prevent a short circuit between third conducting layer 4 and semiconductor substrate 1 has been described. However, the present invention is not limited thereto. For example, when another conducting layer is formed between stopper layer 7 and semiconductor substrate 1, short circuit between third conducting layer 4 and said another conducting layer is prevented by stopper layer 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with an upper conducting layer and a lower conducting layer connected via a contact hole, comprising:

a first lower conducting layer;

a first interlayer insulation film covering said first lower conducting layer;

a second lower conducting layer formed on said first interlayer insulation film 5b and off in a horizontal direction from said first lower conducting layer;

a second interlayer insulation film formed on said first interlayer insulation film so as to cover said second lower conducting layer;

a first contact hole penetrating said first and second interlayer insulation films to expose a surface of said first lower conducting layer;

a second contact hole formed in said second interlayer insulation film to expose a surface of said second lower conducting layer;

an upper conducting layer formed on said second interlayer insulation film and connected to said first and second lower conducting layers via said first and second contact holes; and a stopper layer formed below said second lower conducting layer and in said first interlayer insulation film and formed of silicide.

2. The semiconductor device according to claim 1, wherein said stopper layer is formed of WSi.

3. The semiconductor device according to claim 1, wherein said stopper layer is formed of TiSi.

4. The semiconductor device according to claim 1, wherein said stopper layer includes a layer of polysilicon and a layer of WSi thereon.

5. The semiconductor device according to claim 1, wherein said stopper layer is at the same potential as said upper conducting layer.

6. The semiconductor device according to claim 1, wherein said stopper layer is set to a floating state.

7. The semiconductor device according to claim 1, wherein said first lower conducting layer and said stopper layer are provided over a surface of a semiconductor substrate, respectively, and the distance between said stopper layer and the surface of said semiconductor substrate is equal to the distance between said first lower conducting layer and the surface of said semiconductor substrate.

\* \* \* \* \*